(12) United States Patent
Ivanov et al.

(10) Patent No.: US 11,876,496 B2
(45) Date of Patent: Jan. 16, 2024

(54) DIFFERENTIAL INPUT CIRCUITS WITH INPUT VOLTAGE PROTECTION

(71) Applicant: TEXAS INSTRUMENTS INCORPORATED, Dallas, TX (US)

(72) Inventors: Vadim Valerievich Ivanov, Tucson, AZ (US); Srinivas Kumar Pulijala, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 79 days.

(21) Appl. No.: 17/386,979

(22) Filed: Jul. 28, 2021

(65) Prior Publication Data

US 2023/0034632 A1   Feb. 2, 2023

(51) Int. Cl.
*H03F 3/45* (2006.01)
*H03F 1/52* (2006.01)

(52) U.S. Cl.
CPC ........... *H03F 3/45179* (2013.01); *H03F 1/52* (2013.01); *H03F 2200/426* (2013.01)

(58) Field of Classification Search
CPC .................. H03F 3/45179; H03F 1/52; H03F 2200/426

USPC .................................................. 330/252–261
See application file for complete search history.

(56) References Cited

U.S. PATENT DOCUMENTS 4,206,418 A * 6/1980 Dingwall ......... H03K 17/08122
                                                                      330/253
9,837,973 B2   12/2017 Brantley et al.

* cited by examiner

*Primary Examiner* — Andrea Lindgren Baltzell
*Assistant Examiner* — Khiem D Nguyen
(74) *Attorney, Agent, or Firm* — John R. Pessetto; Frank D. Cimino

(57) ABSTRACT

Differential input circuits employ protection transistors and feedback paths to limit the differential voltage applied to input transistors. In an example arrangement, a differential input voltage is applied to terminals of the protection transistors, and current paths couple the respective protection transistors to control terminals of the input transistors, respectively. A control terminal drive voltage source is coupled to the control terminals of the input protection transistors to control the drive voltage applied to those terminals. Feedback paths, one for each of the input transistors, control voltages applied to the control terminals of the input transistors, maintaining the input differential voltage at a relatively low level and defined by the product of a specified current value and a specified resistance value.

18 Claims, 4 Drawing Sheets

US 11,876,496 B2

DIFFERENTIAL INPUT CIRCUITS WITH INPUT VOLTAGE PROTECTION

FIELD OF DISCLOSURE

This disclosure relates generally to differential input stages, and more particularly to differential input stages with input voltage limit protection.

BACKGROUND

The differential input voltage in operational amplifiers (op amps), e.g., in comparators, should be limited to protect the differential input terminals from gate oxide stress and to maintain junction integrity. Diode clamps have been used to limit peak-to-peak voltage across differential input terminals. These diode clamps, however, conduct high currents under forward bias. Moreover, they increase input capacitance and noise of the circuit, and may slow operation due to forward bias recovery time. Also, large differential voltages exceeding a few 10's of millivolts are known to cause a shift in the offset in metal-oxide-semiconductor (MOS) differential input stages.

A prior art high voltage differential amplifier with diode clamps is shown in FIG. 1. Diodes 102 and 104 are arranged back-to-back and coupled between differential input terminals Vin+ and Vin−. The input terminals Vin+ and Vin− are coupled directly to the gate terminals of low voltage p-channel input transistors 106 and 108, respectively. A common source terminal of p-channel transistors 106 and 108 is coupled to current source 100. The drain terminals of p-channel transistors 106 and 108 are connected to negative and positive input terminals of differential amplifier 110, respectively. In operation, peak-to-peak voltage between input terminals Vin+ and Vin− is limited to a diode voltage drop of approximately 0.7 V plus a voltage developed across the parasitic resistance of the forward biased diode. Diodes 102 and 104 pull current when the differential input voltage exceeds approximately 0.7 V. This pulled current, however, creates problems in some applications. For example, the circuit of FIG. 1 is not well suited for use in a comparator. Diodes 102 and 104 also create large setting time issues in some applications. The circuit of FIG. 1, therefore, protects low voltage p-channel transistors 106 and 108 at the expense of high forward bias diode current, high capacitance, and additional noise. Long-term application of the differential input voltage of 0.7 V also causes significant shift in stage offset.

Another existing approach to protect the gate oxide of the input transistors is to incorporate p-channel switch transistors 202 and 204 in series with sources of input transistors 206 and 208, respectively, as shown in the circuit of FIG. 2. The control gates of input transistors 206 and 208 are coupled to input terminals Vin+ and Vin−, respectively. Current sources 200 are coupled to the respective common source terminals of p-channel transistors 202/206 and 204/208. Drain terminals of p-channel transistors 206 and 208 are coupled to negative and positive input terminals of differential amplifier 210, respectively. In operation, when input terminal Vin− is held to 0 V, p-channel transistors 204 and 208 remain ON. A high positive voltage applied to input terminal Vin+ turns OFF p-channel transistors 202 and 206. In this condition, the common source and bulk terminals of p-channel transistors 202 and 206 are driven high by current source 200. P-channel transistor 204 remains on and drives the common drain terminal of p-channel transistors 202 and 204 high. The drain terminal of p-channel transistor 206 is essentially floating. Thus, there is insufficient voltage across the gate oxide of p-channel transistors 202 and 206 to cause gate oxide damage. However, there is a disadvantage to this approach in that transconductance of the input terminals is reduced by the resistance of p-channel switch transistors 202 and 204. This increases noise and offset voltage and decreases bandwidth of differential amplifier 210.

An improved high voltage differential amplifier is provided in U.S. Pat. No. 9,837,973 ('973 patent), entitled "HIGH VOLTAGE INPUT CIRCUIT FOR A DIFFERENTIAL AMPLIFIER", issued Dec. 5, 2017, and assigned to the assignee of the present application. The content of the '973 patent is incorporated herein by reference.

An embodiment of the high voltage differential amplifier of the '973 patent is shown in FIG. 3 herein. The circuit of FIG. 3 is tolerant of much higher ON resistance from the switch transistors than the circuit of FIG. 2, the latter of which requires that input transistors 206 and 208 be in separate wells, increasing chip area and degrading matching between the input transistors. The approach of FIG. 3 has a common body for p-channel input transistors 310 and 312, allowing for a more compact layout and better input matching. Another benefit is that n-channel switch transistors 306 and 308 can be used with the p-channel front end (i.e., transistors 310 and 312), which is the more common implementation. N-channel switch transistors typically have lower ON resistance than counterpart p-channel switch transistors, further reducing the size of the switches, as compared with the configuration of FIG. 2. As shown in FIG. 3, the drains of transistors 310 and 312 are coupled to the negative and positive inputs, respectively, of differential amplifier 314, which has an output terminal at which Vout is output. A current source 300, e.g., a p-channel current mirror circuit, is coupled between a supply voltage terminal VDD and a common source terminal of input transistors 310 and 312. A reference voltage source 301 of approximately 0.5 V is disposed between the common source terminal of input transistors 310 and 312 and a common gate terminal of transistors 306 and 308. Diode 302 is coupled between the control terminal of input transistor 310 and the control terminal of transistor 306. Diode 304 is coupled between the control terminal of input transistor 312 and the control terminal of transistor 308.

The circuit of FIG. 3 limits the voltage between gates of the input transistors by 1.5 V to 4 V, depending on the value of the voltage source, temperature and leakage, while maintaining the input bias current parameter for differential amplifier 314 low for a wide range of input voltages at amplifier 314. Negative-bias temperature instability (NBTI) remains a concern, however. Offset of the differential stage when operating at high temperature (~125° C.) and with 4 V input voltage may drift 3-4 mV over 10 years or so.

In this context, further improvements arise as set forth below.

SUMMARY

In accordance with an example, a differential input circuit comprises a first input voltage protection transistor (e.g., $M_6$) having a control terminal and a first input terminal of the differential input circuit; a second input voltage protection transistor (e.g., $M_7$) having a control terminal and a second input terminal of the differential input circuit; a first input transistor (e.g., $M_0$) having a control terminal coupled to the first input voltage protection transistor by a first current path; a second input transistor (e.g., $M_1$) having a control terminal coupled to the second input voltage protection transistor by a second current path; a control terminal drive voltage source (e.g., $M_{12}$-$I_1$) coupled to the control terminals of the first and second input protection transistors; a first feedback path (e.g., $M_2$-$M_{2A}$-$M_{10}$-$M_{11}$) coupled to the control terminal of the first input voltage protection transistor; and a second feedback path (e.g., $M_3$-$M_{3A}$-$M_8$-$M_9$) coupled to the control terminal of the second voltage protection transistor.

In accordance with an example, a differential input circuit comprises an input section to which a differential input voltage is applied; a protection section coupled to the input section; a control current source and control transistor coupled to the control current source to control a gate voltage of the protection section; and feedback paths configured to control gate voltages of the input section.

In accordance with an example, a method comprises applying a differential input voltage to control terminals of input transistors through two current paths, one extending from a first input terminal formed by a terminal of a first input voltage protection transistor to the control terminal of one of the input transistors and the other extending from a second input terminal formed by a terminal of a second input voltage protection transistor to the control terminal of another of the input transistors; controlling a gate drive voltage of the first and second input voltage protection transistors using a control current source and a control transistor coupled to the control current source; and controlling the differential input voltage using multiple feedback paths.

These and other features will be better understood from the following detailed description with reference to the accompanying drawings.

BRIEF DESCRIPTION OF THE DRAWINGS

Features of the disclosure may be understood from the following figures taken in conjunction with the detailed description.

The same reference numbers are used in the drawings to designate the same or similar (structurally and/or functionally) features.

DETAILED DESCRIPTION

Figure 1:
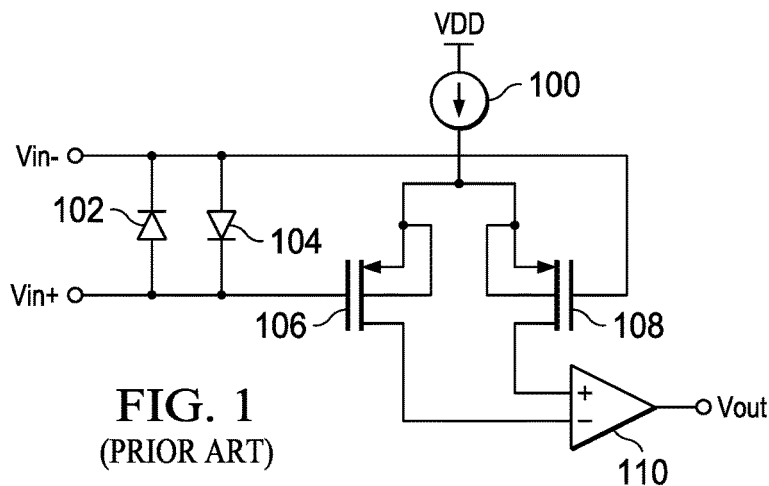
FIG. 1 is a circuit diagram of a prior art high voltage differential amplifier.
Figure 2:
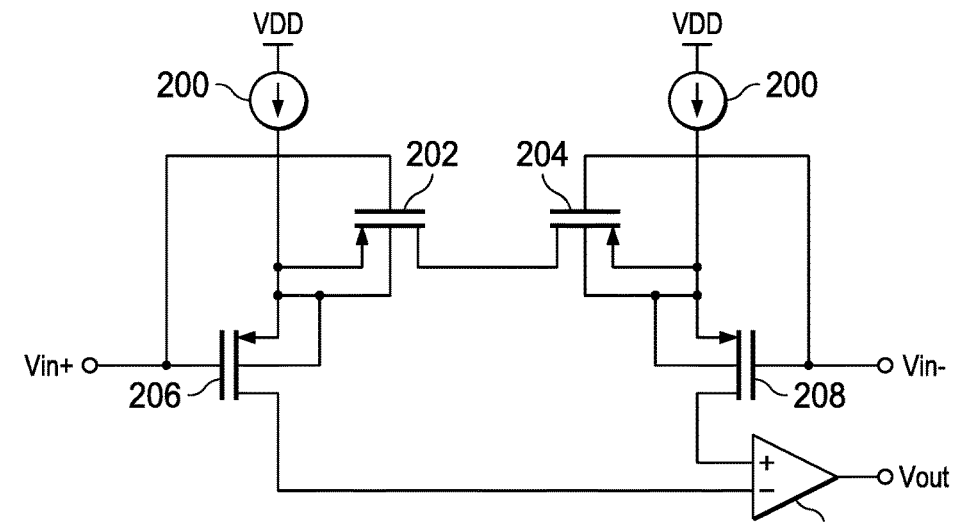
FIG. 2 is circuit diagram of another prior art high voltage differential amplifier.
Figure 3:
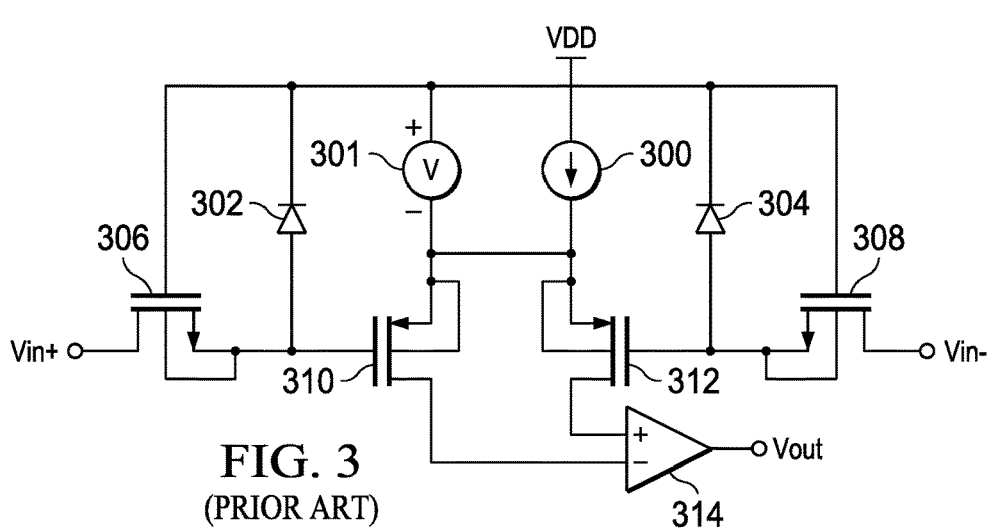
FIG. 3 is a circuit diagram of still another prior art high voltage differential amplifier.

Specific examples are described in detail below with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, the differential input voltage of differential circuits, e.g., differential amplifiers, is limited to improve over-time accuracy of these circuits and the circuits (e.g., op amps and comparators) in which the differential circuits are incorporated. In an example, input transistors that receive a differential input voltage are protected by protection transistors, with their gate drive voltage source implemented by a current source and a control transistor. In an example, feedback paths, one for each input transistor, limit the differential input voltage. In an example, when the differential input voltage rises above an offset value, transistors in each of the feedback loops act to decrease the gate drive voltages of the input voltage protection transistors. In an example, the differential input voltage remains low and well defined by the product of a current value $I_0$ and a value of a resistor $R_0$ in each of the feedback loops. In an example, compensating transistors operate to compensate for leakages at the gates of the input transistors when the protection transistors are turned off.

Figure 4:
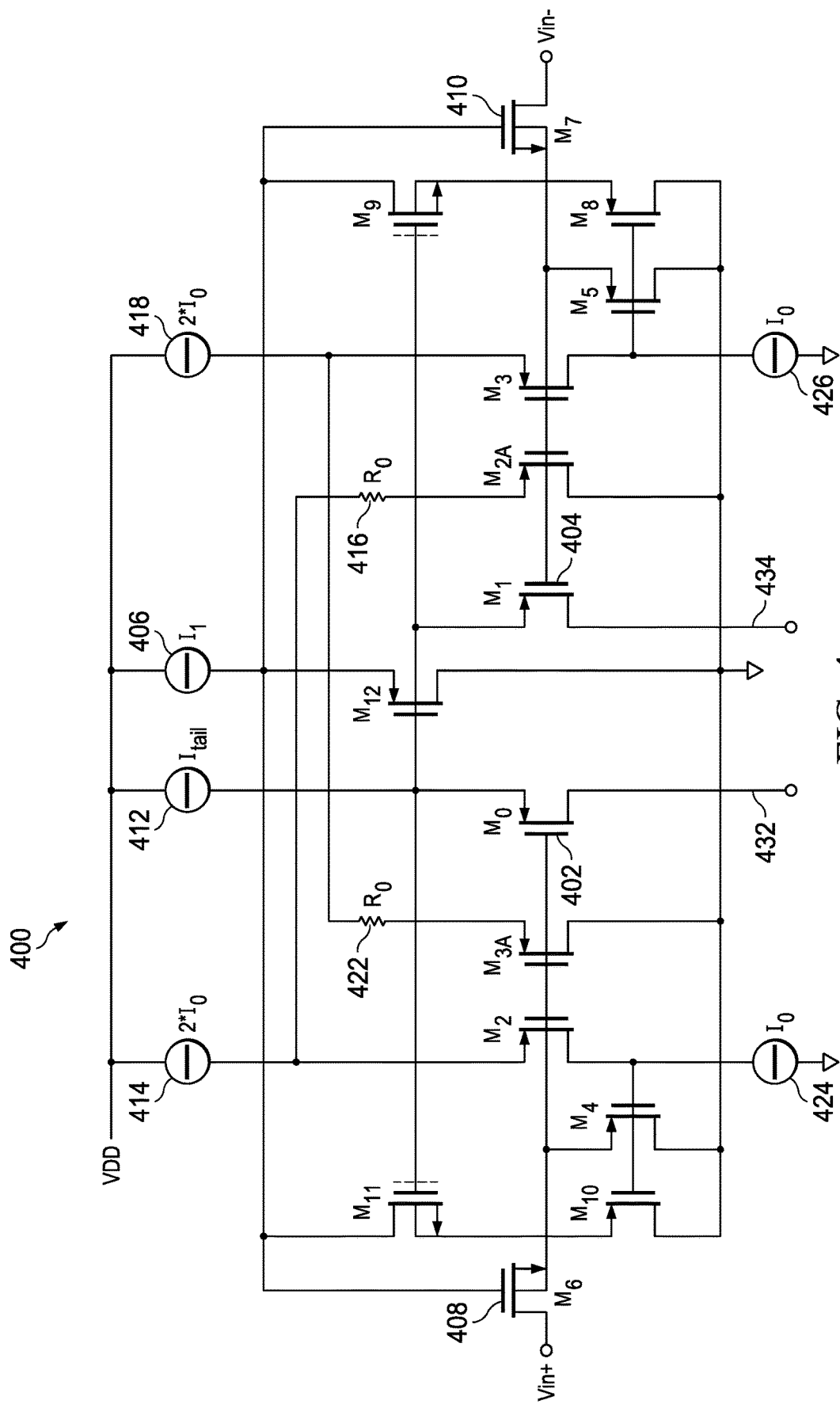
FIG. 4 is a circuit diagram of a differential input circuit.

FIG. 4 is a circuit diagram of an example differential input circuit 400, which may be implemented with complementary metal-oxide-semiconductor (CMOS) technology. Circuit 400 includes first and second input transistors $M_0$ and $M_1$, which form an input differential transistor pair. Each of transistors $M_0$ and $M_1$ may be a p-type metal-oxide-silicon field-effect transistor (MOSFET). $M_0$ and $M_1$ are preferably balanced, have substantially the same threshold voltage, and are oriented to compensate for any slight misalignment during fabrication.

Transistors $M_0$ and $M_1$ and the input voltages applied thereto are protected by transistors $M_6$ and $M_7$, respectively. In an example, each of input voltage protection transistors $M_6$ and $M_7$ is an n-type MOSFET. A first current path extends between a first differential input terminal (Vin+), which may be a drain of $M_6$, and a control, e.g., gate, terminal 402 of $M_0$. Similarly, a second current path extends between a second differential input terminal (Vin−), which may be a drain of $M_7$, and a control, e.g., gate, terminal 404 of $M_1$. The drains of input differential transistor pair $M_0$ and $M_1$ may be coupled to (+) and (−) terminals of a next stage, which may be a differential amplifier, e.g., an op amp, which may be configured as a linear amplifier, integrator, or other special purpose amplifier as is known in the art. The drain of input transistor $M_0$ may form a first output terminal 432 of differential input circuit 400, and the drain of input transistor $M_1$ may form a second output terminal 434 of differential input circuit 400.

N-type transistors $M_6$ and $M_7$ are preferably balanced, and configured to withstand a higher gate-to-drain voltage than input transistors $M_0$ and $M_1$. This may be accomplished by, for example, fabricating transistors $M_6$ and $M_7$ as drain extended n-type transistors as is known in the art. Alternatively, n-type transistors $M_6$ and $M_7$ may be fabricated with a thicker gate dielectric than transistors $M_0$ and $M_1$.

One terminal of a current source 406 is coupled to a supply voltage terminal VDD or positive rail. The other terminal of current source 406 is coupled to control, e.g., gate, terminals 408 and 410 of protection transistors $M_6$ and $M_7$, respectively, to a source terminal of a control transistor $M_{12}$, which may be a p-type MOSFET, and to drain terminals of transistors $M_9$ and $M_{11}$, each of which may be an n-type MOSFET. The drain of transistor $M_{12}$ is coupled to ground. Current source 406, which is configured to deliver a current $I_1$, and control transistor $M_{12}$ form a control, e.g., gate, drive voltage source to provide the gate drive voltage for protection transistors $M_6$ and $M_7$.

A current source 412 coupled at one terminal to VDD and coupled at the other terminal to the source of input transistor $M_0$ and to the source of input transistor $M_1$ via the gate of switch transistor $M_{12}$. Current source 412 is configured to deliver tail current $I_{tail}$ to input transistors $M_0$ and $M_1$. The delivery terminal of current source 412 is also coupled to the gate of transistor $M_{11}$ and to the gate of transistor $M_9$ via the gate of switch transistor $M_{12}$.

Differential input circuit 400 also includes two current sources 414 and 418, each coupled to VDD and configured to deliver a current $2*I_0$. The delivery terminal of current source 414 is coupled to the source of transistor $M_2$ and to one end of resistor 416, the other end of which is coupled to the source of transistor $M_{2A}$. The delivery terminal of current source 418 is coupled to the source of transistor $M_3$ and to one end of resistor 422, the other end of which is coupled to the source of transistor $M_{3A}$. Each of transistors $M_2$, $M_{2A}$, $M_3$ and $M_{3A}$ may be a p-type MOSFET. Resistors 416 and 418 may have the same resistance value $R_0$. In an example, $R_0$ may be 100 KΩ. In other examples, $R_0$ may be a different resistance value.

The source of transistor $M_{10}$ is coupled to the source of transistor $M_{11}$, and the source of transistor $M_8$ is coupled to the source of transistor $M_9$. The drains of transistors $M_{11}$ and $M_8$ are coupled together and to control terminals 408 and 410 of protection transistors $M_6$ and $M_7$, respectively. Each of transistors $M_{10}$ and $M_8$ may be a p-type MOSFET.

A common drain of transistors $M_{2A}$, $M_{3A}$, $M_{10}$ and $M_{11}$ is coupled to ground.

Differential input circuit 400 includes compensating transistors $M_4$ and $M_5$, each of which may be a p-type MOSFET. The source of transistor $M_4$ is coupled to the first current path extending between first differential input terminal Vin+ and the control, e.g., gate, terminal 402 of $M_0$, and the source of transistor $M_5$ is coupled to the second current path extending between second differential input terminal Vin− and the control, e.g., gate, terminal 404 of $M_1$. The drains of transistors $M_4$ and $M_5$, through which very small leakage currents (e.g., in the pA range) run, may be coupled to ground. The gate of transistor $M_4$ is coupled to the gate of transistor $M_{10}$ and also coupled to the drain of transistor $M_2$. The gate of transistor $M_5$ is coupled to the gate of transistor $M_8$ and also coupled to the drain of transistor $M_3$.

A current source 424 is coupled between the drain of transistor $M_2$ and ground or a negative supply rail, and current source 426 is coupled between the drain of transistor $M_3$ and ground or a negative supply rail. Each of current source 424 and 426 is configured to generate a current $I_0$.

In operation of differential input circuit 400, the differential input voltage at the gates of input transistors $M_0$ and $M_1$ is accurately limited within a relatively narrow range by two feedback paths or loops, one for each of input transistors $M_0$ and $M_1$. A first feedback path or loop, which is for input transistor $M_0$, is formed by transistors $M_2$, $M_{2A}$, $M_{10}$ and $M_{11}$. A second feedback path or loop, which is for input transistor $M_1$, is formed by transistors $M_3$, $M_{3A}$, $M_8$ and $M_9$. The first feedback path is coupled to control, e.g., gate, terminal 408 of input voltage protection transistor $M_6$, and the second feedback path is couple to control, e.g., gate, terminal 410 of input voltage protection transistor $M_7$.

The first feedback path includes two current path branches, both coupled to current source 414. One branch includes transistor $M_2$ and the other includes resistor 416 and transistor $M_{2A}$ coupled to resistor 416. The second feedback path also includes two current path branches, which are coupled to current source 418. One branch includes transistor $M_3$ and the other includes resistor 422 and transistor $M_{3A}$ coupled to resistor 422.

When the input differential voltage at the gates of $M_0$ and $M_1$ increases above an offset (e.g., 10-200 mV) of these feedback paths, the voltage defined $I_0R_0$ and transistor pair $M_5$-$M_9$ and/or transistor pair $M_{10}$-$M_{11}$ start to decrease the gate drive voltages at transistors $M_6$ and/or $M_7$ to maintain the input differential voltage at the gates of transistors $M_0$ and $M_1$ at a low value and well defined by $I_0R_0$. Each of transistor pair $M_5$-$M_9$ and transistor pair $M_{10}$-$M_{11}$ act as a feedback control component. As the gate drive voltages of transistors $M_6$ and $M_7$ decrease, transistors $M_4$ and $M_5$ start operating to compensate for leakage at the gates of transistors $M_0$ and $M_1$.

Each of current sources 406, 412, 414, 418, 424 and 426 in differential input circuit 400 may be implemented as a p-type MOSFET current mirror circuit as is known in the art.

Figure 5:
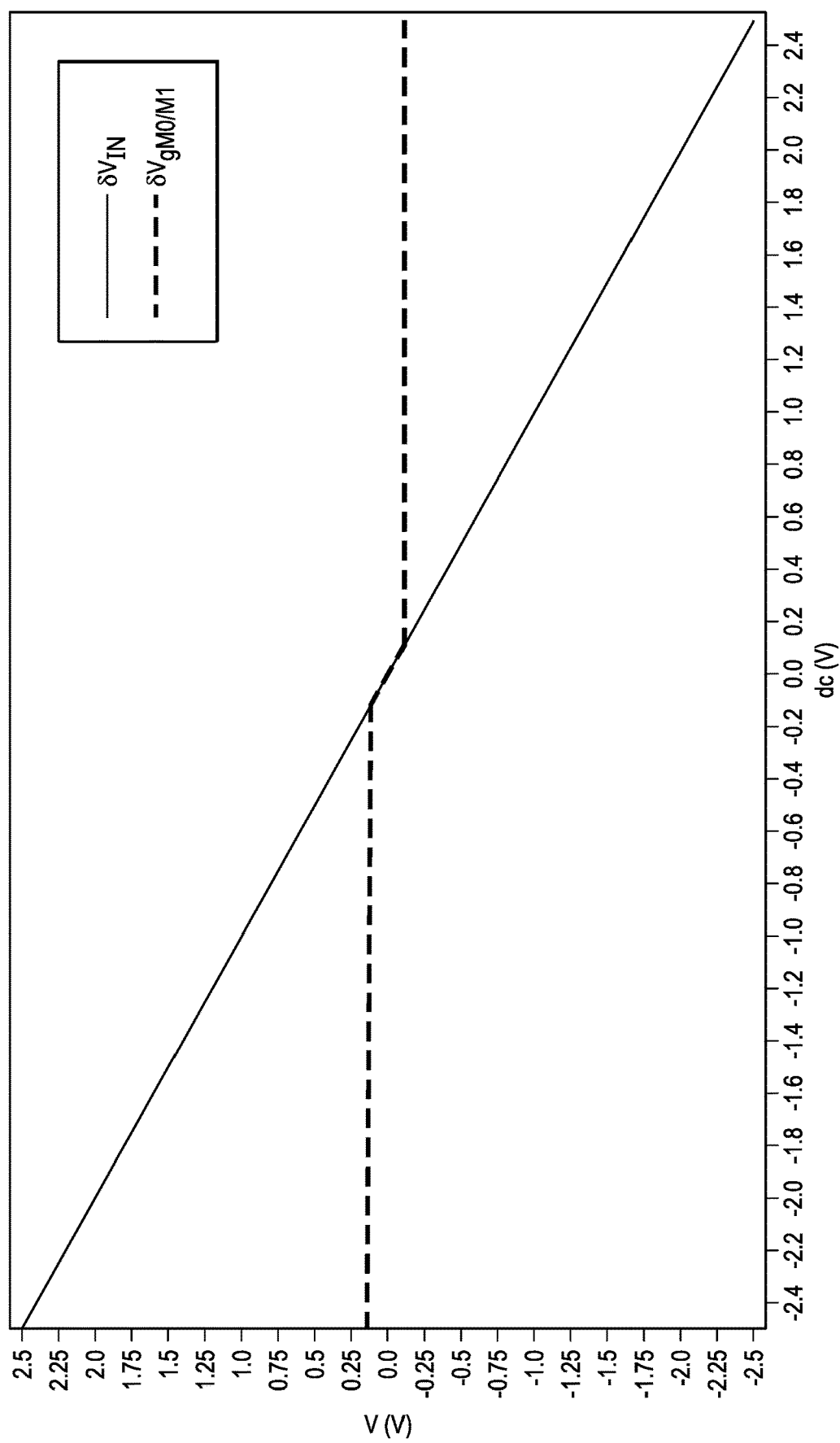
FIG. 5 is a graph showing control of the differential input voltage at the gates of the input transistors over a range of differential input voltages applied to the drains of protection transistors.

FIG. 5 is a graph showing control of the differential input voltage at the gates of input transistors $M_0/M_1$ ($\delta gM0/M1$) as the differential input voltage applied at terminals Vin+ and Vin− ($\delta V_{in}$) varies. In this example, $I_0$ is approximately 1 μA, and $R_0$ is approximately 100 KΩ. As can be seen, the differential input voltage at input transistors $M_0/M_1$ remains low and within a relatively narrow range for a wide range of differential input voltages at Vin+ and Vin−.

Figure 6:
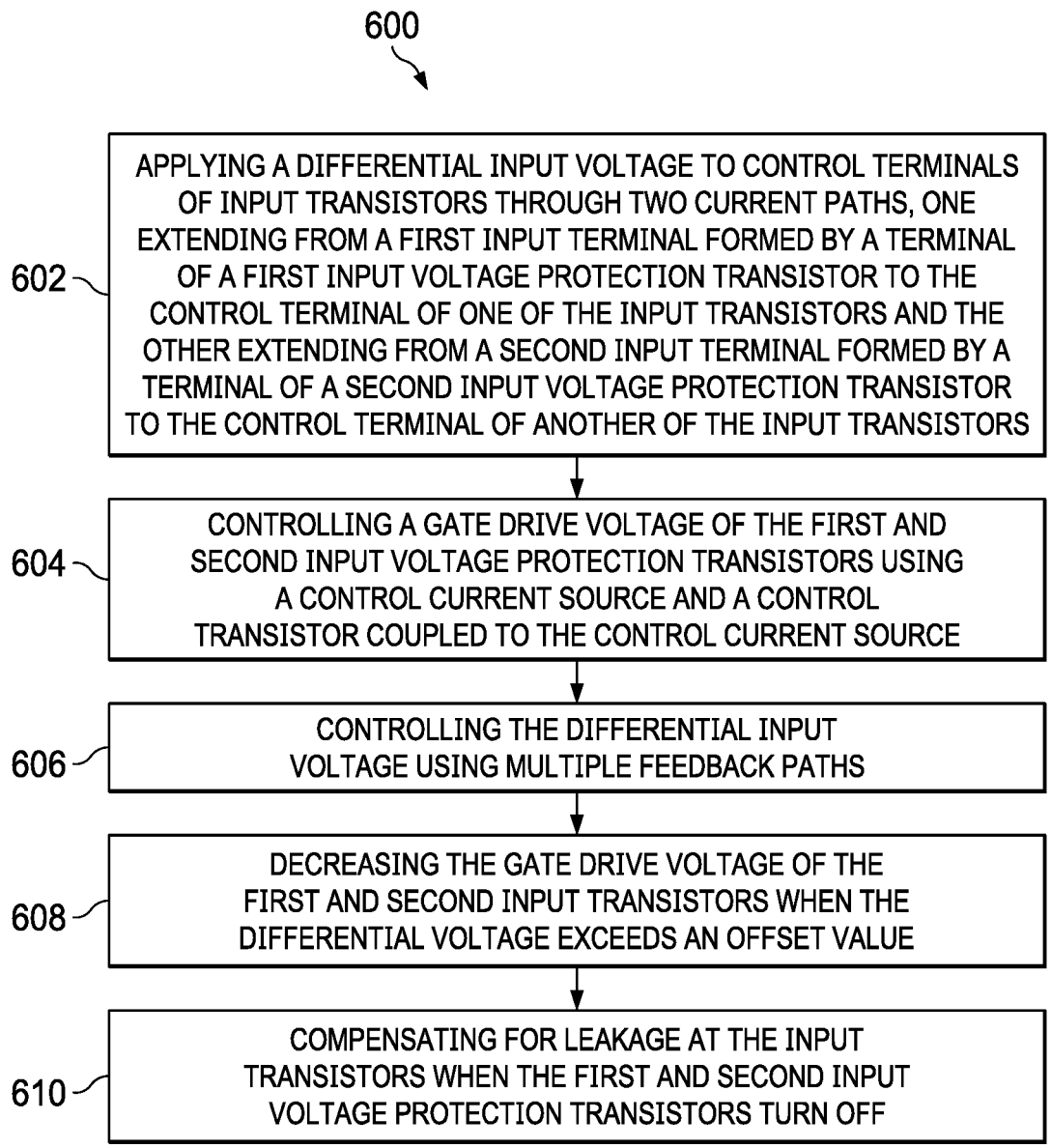
FIG. 6 is a flow diagram of an example method of operating a differential input circuit, such as that shown in FIG. 4.

FIG. 6 is a flow diagram 600 of an example method of operating a differential input circuit, such as that shown in FIG. 4. An example method includes applying a differential input voltage (e.g., difference between Vin+ and Vin−) to control terminals (e.g., 402 and 404) of input transistors (e.g., $M_0$ and $M_1$) through two current paths, one extending from a first input terminal (e.g., Vin+) formed by a terminal of a first input voltage protection transistor (e.g., $M_6$) to the control terminal (e.g., 402) of one of the input transistors (e.g., $M_0$) and the other extending from a second input terminal (e.g., Vin−) formed by a terminal of a second input voltage protection transistor (e.g., $M_7$) to the control terminal (e.g., 404) of another of the input transistors (e.g., $M_1$). The example method further includes controlling a gate drive voltage of the first and second input voltage protection transistors using a control current source (e.g., 406, $I_1$) and a control transistor (e.g., Mia) coupled to the control current source, and controlling the differential input voltage using multiple feedback paths (e.g., $M_2$, $M_{2A}$, $M_{10}$ and $M_{11}$; and $M_3$, $M_{3A}$, $M_8$ and $M_9$).

In an example, the further comprises decreasing the gate drive voltage of the first and second input voltage protection transistors when the differential input voltage exceeds an offset value, which may be in the range of 10-200 mV. In an example, the method further comprises compensating for leakage at the input transistors when the first and second input voltage protection transistors turn off.

FIG. 6 depicts one possible order of operations in operating a differential input circuit. Not all operations need necessarily be performed in the order described. Some operations may be combined into a single operation. Additional operations may be performed as well.

Various examples of differential input circuits that improve accuracy by decreasing over-time drift of the differential input voltage offset by accurately limiting the differential input voltage. In examples, feedback paths are incorporated to limit the differential input voltage by a well-defined value, e.g., $I_0R_0$, and thus set an upper limit that the differential input voltage may reach. Such examples advantageously provide circuits that operate on relatively small differential input voltages while maintaining the input bias current parameter for the downstream differential amplifier low.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type MOSFET may be used in place of an n-type MOSFET, and vice versa, with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a signal ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications of the described examples are possible, as are other examples, within the scope of the claims. Moreover, features described herein may be applied in other environments and applications consist with the teachings provided.

What is claimed is:

1. A differential input circuit, comprising:
   a first input voltage protection transistor having a control terminal and a first input terminal of the differential input circuit;
   a second input voltage protection transistor having a control terminal and a second input terminal of the differential input circuit;
   a first input transistor having a control terminal coupled to the first input voltage protection transistor by a first current path;
   a second input transistor having a control terminal coupled to the second input voltage protection transistor by a second current path;
   a control terminal drive voltage source coupled to the control terminals of the first and second input protection transistors;
   a first feedback path coupled to the control terminal of the first input voltage protection transistor; and
   a second feedback path coupled to the control terminal of the second voltage protection transistor.

2. The differential input circuit of claim 1, wherein the control terminal drive voltage source includes a control current source and a control transistor coupled to the control current source.

3. The differential input circuit of claim 2, wherein the first feedback path includes a first feedback control component coupled to the control current source and to the control terminal of the of the first input voltage protection transistor.

4. The differential input circuit of claim 2, wherein the second feedback path includes a second feedback control component coupled to the control current source and to the control terminal of the of the second input voltage protection transistor.

5. The differential input circuit of claim 3, wherein the first feedback control component includes a first transistor coupled to a first terminal of the control transistor and the control terminal of the first input voltage protection transistor; and a second transistor coupled between the first transistor and a second terminal of the control transistor.

6. The differential input circuit of claim 5, wherein the first feedback path includes a branched current path, one branch of which includes a third transistor and another branch of which includes a resistor and a fourth transistor coupled to the resistor.

7. The differential input circuit of claim 4, wherein the second feedback control component includes a first transistor coupled to a first terminal of the control transistor and the control terminal of the second input voltage protection transistor; and a second transistor coupled between the first transistor and a second terminal of the control transistor.

8. The differential input circuit of claim 7, wherein the second feedback path includes a branched current path, one branch of which includes a third transistor and another branch of which includes a resistor and a fourth transistor coupled to the resistor.

9. The differential input circuit of claim 1, comprising:
   a tail current source coupled to a common terminal of the first and second input transistors,
   wherein another terminal of the first input transistor is a first output terminal of the differential input circuit and another terminal of the second input transistor is a second output terminal of the differential input circuit.

10. The differential input circuit of claim 9, comprising:
a first compensating transistor coupled between the second current path and ground; and
a second compensating transistor coupled between the first current path and ground.

11. The differential input circuit of claim 1, wherein the first feedback path is coupled to a first current source configured to generate a current having a value of $2I_0$, the first feedback path including a first resistor having a set resistance value, and the second feedback path is coupled to a second current source configured to generate a current having a value of $2I_0$ and a second resistor having the set resistance value.

12. The differential input circuit of claim 11, wherein a differential input voltage determined by a voltage applied to the control terminal of the first input transistor and a voltage applied to the control terminal of the second input transistor is defined by the product of $I_0$ and the set resistance value.

13. A differential input circuit, comprising:
an input section to which a differential input voltage is applied;
a protection section coupled to the input section;
a control current source and control transistor coupled to the control current source to control a gate voltage of the protection section;
feedback paths configured to control gate voltages of the input section; and
a compensation section configured to compensate for leakage at gates of the input section.

14. The differential input circuit of claim 13, wherein the compensation section is configured to start to operate when the protection section turns off.

15. The differential input circuit of claim 13, wherein the feedback paths comprise a first feedback path configured to control a first input voltage to the input section, and a second feedback path configured to control a second input voltage to the input section, the differential input voltage being based on the first and second input voltages.

16. The differential input circuit of claim 15, wherein the protection section includes first and second input voltage protection transistors, the first feedback path includes a pair of transistors configured to decrease a drive voltage applied to a control terminal of the first input voltage protection transistor, and the second feedback path includes a pair of transistors configured to decrease a drive voltage applied to a control terminal of the second input voltage protection transistor.

17. A method comprising:
applying a differential input voltage to control terminals of input transistors through two current paths, one extending from a first input terminal formed by a terminal of a first input voltage protection transistor to the control terminal of one of the input transistors and the other extending from a second input terminal formed by a terminal of a second input voltage protection transistor to the control terminal of another of the input transistors;
controlling a gate drive voltage of the first and second input voltage protection transistors using a control current source and a control transistor coupled to the control current source;
controlling the differential input voltage using multiple feedback paths; and
compensating for leakage at the input transistors when the first and second input voltage protection transistors turn off.

18. The method of claim 17, comprising:
decreasing the gate drive voltage of the first and second input voltage protection transistors when the differential input voltage exceeds an offset value.

* * * * *